Oct. 21, 1969 P. D. DAVIDSE ET AL 3,474,021

METHOD OF FORMING OPENINGS USING SEQUENTIAL SPUTTERING AND CHEMICAL ETCHING

Filed July 25, 1966 2 Sheets-Sheet 1

INVENTORS
PIETER D. DAVIDSE
VIR A. DHAKA
LEON I. MAISSEL

BY George O. Saile
ATTORNEY

Oct. 21, 1969 P. D. DAVIDSE ET AL 3,474,021
METHOD OF FORMING OPENINGS USING SEQUENTIAL SPUTTERING AND CHEMICAL ETCHING
Filed July 25, 1966 2 Sheets-Sheet 2
FIG. 5
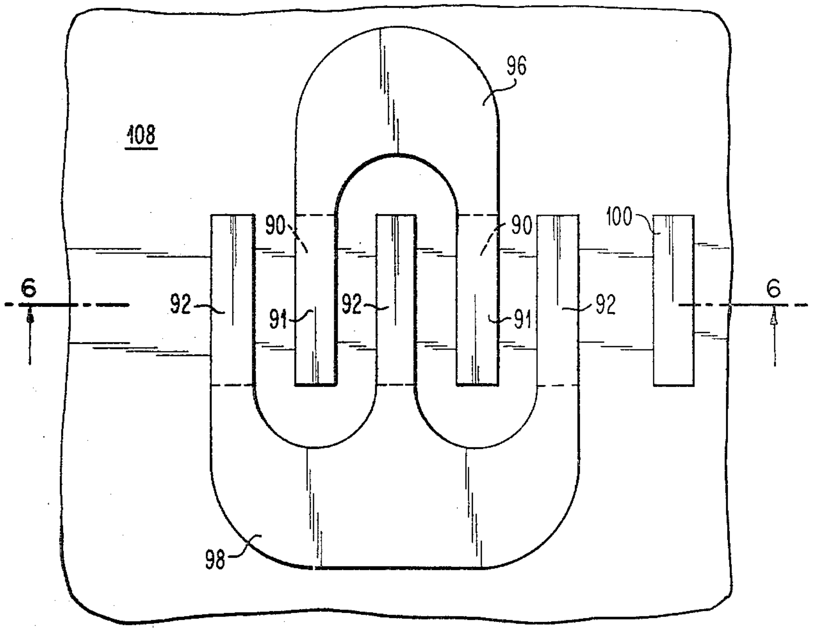
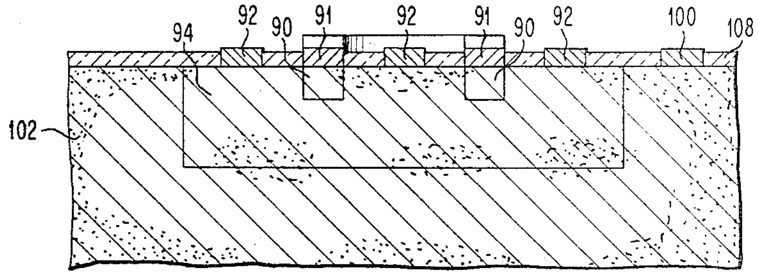
FIG. 6
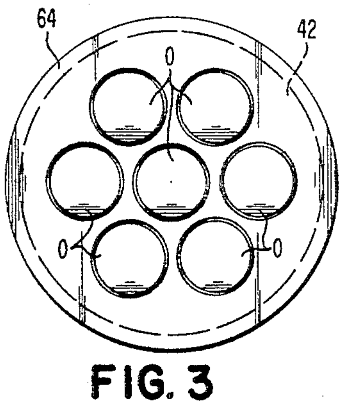
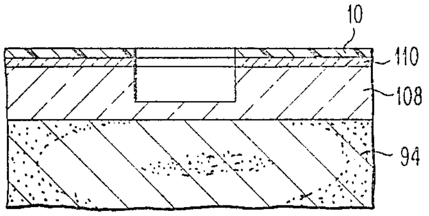
FIG. 3 FIG. 6A United States Patent Office 3,474,021

Patented Oct. 21, 1969

3,474,021
METHOD OF FORMING OPENINGS USING SEQUENTIAL SPUTTERING AND CHEMICAL ETCHING

Pieter D. Davidse, Vir A. Dhaka, and Leon I. Maissel, Poughkeepsie, N.Y., assignors to International Business Machines Corporation, Armonk, N.Y., a corporation of New York Filed July 25, 1966, Ser. No. 567,485
Int. Cl. C23c *15/00*
U.S. Cl. 204—192 8 Claims

ABSTRACT OF THE DISCLOSURE

An etching method to form very narrow openings in coatings. The method is particularly useful in forming openings in easily fractured, inorganic layers covering semiconductor devices. The method involves first masking to define the areas of the coating to be removed. The coating in those portions not covered by the mask is then subjected to sputter etching in an appropriate sputtering chamber to remove the coating to a depth which leads about 100 to 1,000 A. of the coating. The coating is then chemically etched to remove the remaining portions of the coating in the opening. In this manner an opening with almost uniformly vertical sides is produced.

This invention relates to an etching process, and more particularly to a process for etching very narrow openings in a coating covering an object.

Narrow openings are generally made by chemical etching in the desired region after protecting the areas not to be etched by some kind of a material which is resistant to the effect of the chemical. It is, however, difficult to obtain a precisely defined opening because of the nature of chemical etching of simultaneously proceeding in all direction from an opening, vertical as well as lateral. Thus, even if one starts out with a well defined surface opening using a surface protective coating, the resulting opening after the chemical etching will be much less well defined because of the lateral etching effect.

Two basic criteria, the emitter stripe width and emitter depth, determine the design of ultra high frequency transistors. In these devices emitter stripe width must be of the order of less than about 2.5 microns and the base width is kept minimal without increasing the sheet resistivity of the base region. Using the double diffusion planar device process for manufacturing semiconductor devices, this can be accomplished by making the junctions as shallow as practical. It would, however, be essential that a strict control on the emitter width be maintained and that the emitter-base junction where it comes to the surface has a adequate passivation layer. The openings through the passivation and diffusion mask layers must be as near perfect as possible, with practically no lateral undercutting of the coating to produce precise devices. Further, the semiconductor device itself must not be at all etched by the etching method.

Sputter etching of coatings covering semiconductor devices has been accomplished and described in patent application Ser. No. 540,054 entitled "Etching Method" by Pieter D. Davidse and assigned to the same assignee as the present invention. In this patent application material is removed from an object by bombardment of the object with high-energy ions that are directed through a mask defining the patterns to be etched in the object. The great problem with this etching method is that the method will proceed independently of material. Therefore, when the diffusion mask or passivation coating has been etched through sputter etching continues into the semiconductor material. A continuation of the sputter etching process in to the semiconductor device would have adverse effects on the device. There is at present no convenient technique for stopping the sputter etching process just at the semiconductor surface. On the other hand, halting the sputter etching before the semiconductor surface is reached will make for a poor subsequent electrical contact to that surface.

It is thus an object of the present invention to provide a new method for forming openings in a coating covering an object without adversely affecting the object.

It is another object of the present invention to provide an etching method for etching openings of less than about 2.5 microns in one width dimension in a coating covering a semiconductor surface of an object.

It is a further object of this invention to provide a combination etching method utilizing both sputter etching and chemical etching to obtain a near perfect narrow width opening to the surface of a semiconductor device.

These and other objects are accomplished in accordance with the broad aspects of the present invention by forming an opening in a coating on an object by using a combination of two etching steps. The coating to have an opening or openings therein is first masked to define the areas of the coating to be removed. The coating in those portions not covered by the mask is then subjected to sputter etching in an appropriate sputtering chamber to remove the coating to a depth which leaves about 100 to 1000 Angstroms of the coating. The coating is then chemically etched to remove the remaining portions of the coating in the opening. In this manner an opening with almost uniformly vertical sides is produced. There is only a slight lateral spread in the opening in the area where the chemical etching has taken place. This method is particularly applicable to forming narrow openings of less than about 2.5 microns in one width dimension in a diffusion mask or passivation insulator coating covering a semiconductor surface. Chemical etching which has been used to produce these openings proceeds in all directions from the opening, vertical as well as lateral and therefore produces an imperfect opening. Further, chemical etching takes a substantial amount of time when etching openings of less than about 2.5 microns because of the physical effect on the etching process caused by the narrow opening. This substantial time seems to promote the lateral etching and produces substantial undercutting of the mask which defines the desired opening in the coating. The combination sputtering and chemical etching procedure of the present invention alleviates this difficult problem.

The foregoing and other objects, features and advantages of the invention will be apparent from the following more particular description of the preferred embodiments of the invention as illustrated in the accompanying drawings:

FIGURE 3 is a view of the target of the sputtering chamber taken along lines 3—3 of FIGURE 2;

FIGURE 5 is a plane view of a semiconductor device structure resulting from the use of the process of the present invention;

FIGURE 6 is a cross-sectional view taken along lines 5—5 of FIGURE 5; and

FIGURE 6*a* is a cross-sectional view showing one opening of the FIGURE 6 after the sputter etching step and before the chemical etching step.

Figure 1:
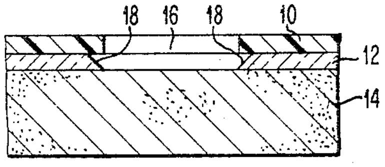
FIGURE 1 is a cross-sectional view of the product resulting from the prior art chemical etching process.

Referring now more particularly to FIGURE 1 there is shown the resulting opening from the prior art chemical etching process. The protective mask 10 was coated over the entire surface of a silicon dioxide layer 12 which covered the semiconductor 14. The coating 10 was a photoresist material. The mask opening 16, which was about 2.5 microns in width, was obtained by conventional photo and etching techniques. The aticle was then immersed in an ammonium fluoride buffered hydrofluoric acid etchant for the silicon dioxide layer 12. Lateral as well as vertical etching resulted and an undercutting which approaches a 45° angle at 18 resulted. The undercutting would have been even more serious if a phosphosilicate glass layer, as is preferred, was present over the surface of layer 12. The phosphosilicate glass is used to ensure temperature-bias life test reliability. This glass is particularly susceptible to etching by the buffered hydrofluoric acid etchant which is used to remove portions of the silicon dioxide layer.

The first step in the present method for forming openings having near-perfect vertical edges is the sputter etching of those portions of the coating which are not covered by a mask until there remains a depth of coating between about 100 to 1000 Angstroms, and preferably between about 300 to 600 Angstroms, above the object. A mask is applied over the coating covering the object which is to have an opening therein. One preferred mask is a coating of masking material directly on the surface of the coated object. A convenient type of masking material is a photosensitive resist such as Kodak thin film resist (KTFR). Once applied, the photoresist coating is photographically processed in the usual manner to define the desired mask pattern for the subsequent etching of the coating over the object. The result of the process is openings in the photoresist mask coating in the desired areas to be etched. The exposed portions of the coating on the object are to be substantially removed by sputter etching while the covered portions of the coating are to be protected from the sputtering by the mask coating of the photoresist. To protect the covered portions of the coating from sputtering, the photoresist mask coating material must have a lower sputtering rate than the coating on the object or must be thicker than the coating on the object. This is because the photoresist mask coating is sputtered along with the coating on the object.

Figure 2:
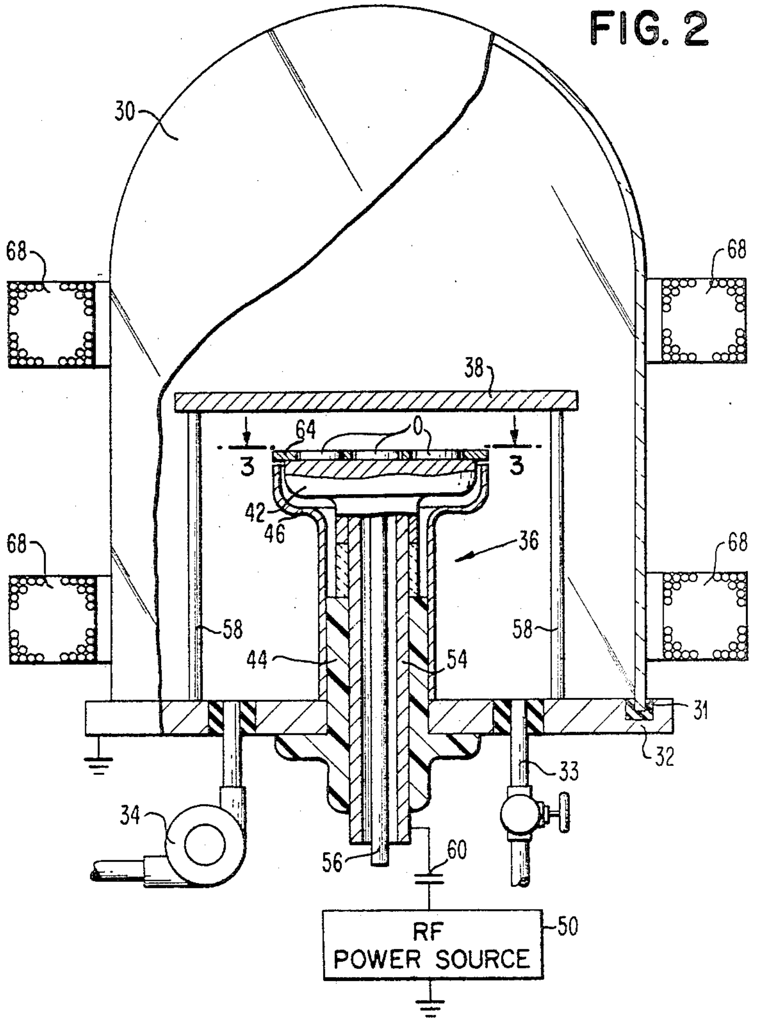
FIG. 2 PRIOR ART
FIGURE 2 is a schematic drawing of a sputtering system useful in practising one etching step of the present invention.

Referring to FIGURES 2 and 3 there is shown one preferred sputter etching chamber which is suitable for the first step of the present etching process. A low-pressure gas ionization chamber is enclosed by an envelope in the form of a bell jar 30 made of a suitable material such as a high temperature glass, which is removably mounted on a base plate 32. A gasket 31 between the jar 30 and metal plate 32 provides a vacuum seal. A suitable gas such as argon, supplied by a source 33, is maintained at a desired low pressure of between about 2 to 10 microns of mercury in the enclosure by means of a vacuum pump 34. The structure 36 within the gas-filled enclosure 30 serves as a cathode while the metal plate 32 and structure 38 within the chamber serve as the anode. The terms "cathode" and "anode" are employed merely for convenience herein inasmuch as the relative polarities of the structure 36 and plate 12 and structure 38 will alternate while sputter etching is performed in accordance with the present invention. However, as shall be apparent hereafter, this reversal of polarities does not affect a reversal of the sputtering operation.

The cathode assembly 36 has objects O to be sputter etched mounted on the metal electrode 42. This electrode 42 is supported by a hollow supporting column or post 44 which is secured to the base plate 32. Supported on the post 44 is a metallic shield 46 having an upwardly-extending annular lip portion that partially encloses the electrode 42. A metal tube or pipe 54 extends vertically through the post 44. The lower portion of the tube 54 extends down through an opening in the metal plate 32. The electrode 42 is supported on the upper end of the vertical tube 54. The electrode 42 can have a central space (not shown) within which ordinary tap water may be circulated to keep the temperature of the electrode 42 from rising too high while the apparatus is operating. Tap water can flow through the tube 54 and exit from the tube through the central tube 56.

An anode plate 38 maintained at the potential of base plate 32 is preferably positioned closely adjacent to the objects O. The plate is mounted on support members 58 which are in turn mounted on plate 32. The anode plate 38 may be cooled by provision of an internal cooling coil or similar means (not shown).

The voltage is applied to the electrode 42 from the radio-frequency power source 50. One side of the source 50 is grounded, and the other side thereof is connected through a capacitor 60 through the tube 54 to the electrode 42. The shield 46 is maintained at ground potential. The shield 46 is insulated from the electrode 42. The grounded shield 46 serves to suppress any glow discharge that otherwise might take place behind the target electrode 42. As shown in FIGURE 3, the number of objects O to be sputter etched are positioned on the electrode 42 through circular holes in a quartz, alumina or similar disc 64 which covers the electrode 42. The disc 64 is used to prevent sputtering of the metal electrode 42. Alternatively, the disc 64 could be eliminated and the objects O positioned in a similar manner on the exposed surface of the metal electrode 42. Electromagnets 68 are preferably used to concentrate the glow discharge by the magnets' magnetic field.

The sputter etching step is continued until the coating is removed to a depth which leaves about 100 to 1000 Angstroms of coating. When greater than 1000 Angstrom units of coating are allowed to remain, the advantage of the combined etching procedure is lost in part and the same disadvantages of the complete chemical etching technique are encountered. Where less than the 100 Angstrom units are allowed to remain, there is the danger of sputter etching into the object, and thereby damaging the object. The preferred range of coating depth is 300 to 600 Angstroms.

The next step is to chemically etch the remaining coating in the areas to be opened to the object. The chemical used for etching is chosen so that the chemical attacks only the coating and not the object. This allows the automatic stopping of the etch when the object is reached. However, care must be taken not to allow the etch to remain in contact for an extended time with the coated object because this will allow the objectionable lateral etching of the coating.

Figure 4:
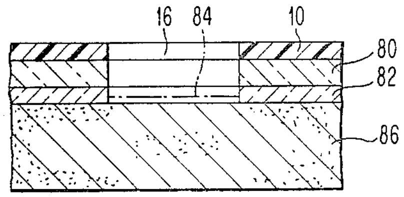
FIGURE 4 is a cross-sectional view of another form of the invention.

FIGURE 4 shows an embodiment wherein a composite coating is used. This embodiment is very important where the upper coating 80 has particularly desirable physical and chemical characteristics but cannot be chemically etched or is difficult to chemically etch. In this case, the solution is to use a lower object protective coating 82 which can be easily chemically etched. The previously described process is then followed, wherein a mask 10 is applied to the upper surface of the coated object to define an opening 16, the coated object is then subjected to sputter etching until the upper coating 80 is completely removed and the protective coating 82 is partially removed, for example, down to a depth of the line 84. The protective coating should be of a thickness of at least between about 300 to 1000 Angstrom units, so as to give adequate protection from the sputter etching step to the object 86. The process is completed by a chemical etching step to remove the remaining portion of the coating 82 from the surface of the object 86.

An important example of the use of the FIGURE 4 embodiment is in the semiconductor art. Silicon nitride is a very desirable passivating coating for semiconductor devices. However, silicon nitride is extremely difficult to chemically etch. Sputter etching is the most satisfactory method for making openings in the silicon nitride coating so as to make contact to the elements of the semiconductor device. The difficulty as enumerated above with sputter etching is that one may over sputter etch and damage the semiconductor device. Therefore, the use of a chemical etchable coating 82 allows the effective formation of openings in the composite coated structure, which includes the upper passivating silicon nitride coating.

FIGURES 5, 6 and 6*a* illustrate a high frequency transistor structure which is made possible by the use of the present etching process. The emitter stripes 90 are very narrow and long. A typical example of the stripe width and length is 2.5 microns and 42.5 microns respectively. The contacts 92 for the base element 94 of these transistors are parallel to the emitter contact 91 and emitter stripes 90, and should be positioned as close to the emitter stripes 90 as possible. Examples of the contacts widths are 2.5 microns, and distance between stripes is 2.5 microns. The transistors are typically five or more stripe structures as shown in the FIGURE 5. The emitter stripes 90 are illustrated as in common by use of an extended metal contact area 96. The base contacts are also in common by use of an extended metal contact area 98. The collector contact 100 connects the collector element 102 of the semiconductor device with an external source. The contacts 92, 96, 98 and 100 may be applied by the blanket vacuum deposition of an alloy of aluminum and silicon onto the wafer. Conventional photoresist, photographic and etching techniques are used to put the desired mask pattern on the deposited metal. The metal alloy is then preferably sputter etched and chemically etched to produce the contact pattern shown in FIGURE 5. The combined sputter etching and chemical etching process is preferred for the reasons explained above.

The following is an example of the present invention being used to manufacture high frequency transistors. The example is included merely to aid in the understanding of the invention, and variations may be made by one skilled in the art without departing from the spirit and scope of this invention.

An N/N+ wafer having an overlayer of about 5000 Angstroms of steam grown silicon dioxide was the starting material. A kodak KTFR photoresist mask pattern was applied over the silicon dioxide layer for base diffusion. Silicon dioxide in the base regions was then etched away by an ammonium fluoride buffered hydrofluoric acid etchant. A P-type boron diffusion was then performed to form the base region. An additional layer of approximately 2000 Angstrom units of silicon dioxide was then grown on the silicon substrate by heating the substrate in steam at a temperature of about 970° C. A layer of phosphosilicate glass having a thickness of about 1000 Angstrom units was deposited over the silicon dioxide surface at approximately 970° C. by exposing the silicon dioxide coated substrate to a phosphorous pentoxide atmosphere. The resulting structure was oxidized in steam at 950° C. for about 100 minutes to decrease the etch rate of the phosphosilicate glass so that it is not etched away during the subsequent chemical dip etching opening of the emitter contact holes and to increase the adhesion of the surface to photoresist. A photoresist mask pattern establishing the emitter stripe configuration was precisely formed on the phosphosilicate glass layer 110 by conventional photoresist and etching techniques. The masked object was subjected to the R.F. sputtering in the chamber shown in FIGURE 2. The emitter openings were in this way partially etched out through the phosphosilicate glass 110 and silicon dioxide 108 layers, leaving a depth of silicon dioxide layer 108 of approximately 500 Angstrom units, as shown in FIGURE 6*a*. The emitter openings were then completed to the semiconductor surface 94 by means of an ammonium fluoride buffered hydrofluoric acid chemical etch. The photoresist mask pattern was removed. The N-type diffusant, phosphorous, was then diffused into the base region semiconductor material 94 to produce the emitter-base junction having a width of less than about 2.5 microns in its width dimension. Emitter diffusion itself results in the formation of a thin phosphosilicate glass formation. In order that the photoresist adheres properly to the surface in the subsequent step, this phosphosilicate glass must be removed. The phosphosilicate glass in emitter openings was removed by dissolving in an etch which was composed of 15 parts hydrofluoric acid, 10 parts nitric acid and 300 parts water. Another photoresist mask pattern establishing the base contact configuration was precisely formed on the phosphosilicate glass layer 110 by conventional photoresist and etching techniques. The base contacts were opened using the R.F. sputtering and chemical etch combination process wherein sputter etching was completed to a depth whereat about 300 Angstroms of silicon dioxide remained on the surface of the semiconductor 94 in the unmasked regions. The base contact openings were then completed by an ammonium fluoride buffered hydrofluoric acid chemical etch. The mask pattern was removed. A slight buffer etch which was compoesd of 1 part of the mixture of 20 grams of ammonium phosphate dissolved in 140 cubic centimeters of water and 2 parts of ammonium fluoride was then applied to remove all extraneous matter from the contact areas. The contact metal aluminum-silicon alloy was vacuum evaporated over the entire surface area to a thickness of approximately 7000 Angtsroms. The metal was then covered with photoresist material and a mask pattern was developed and etched by conventional techniques to provide the desired contact pattern. Openings were made in the unmasked regions using the sputter etching to a depth of 300 Angstroms and then chemically etching the remaining alloy using phosphoric acid etch. The resulting structure is shown in FIGURES 5 and 6.

While this invention has been particularly shown and described with reference to preferred embodiments thereof, it will be understood by those skilled in the art that the foregoing and other changes in form and detail may be made therein without departing from the spirit and scope of the invention.

What is claimed is:

1. A method for forming openings in a coating on an object comprising:

masking the coating with a mask defining areas of the said coating to be removed;

removing the said coating in those portions which are not covered by said mask by sputtering;

said coating being removed to a depth which leaves about 100 to 1000 Angstroms of said coating above said object in the said portions which are not covered by said mask; and chemically etching away the remaining said coating in said openings.

2. The method of claim 1 wherein the said openings being formed are less than about 2.5 microns in one width dimension.

3. The method of claim 1 wherein said coating is a composite coating of at least two layers, the upper layer of said composite coating being easily fractured, inorganic and difficult to chemically etch, and at least substantially removing the said upper coating in those portions which are not covered by the said mask by sputtering.

4. A method for etching openings of less than about 2.5 microns in one width dimension in an insulator coating covering a semiconductor surface of an object comprising:

masking said coating with a mask contiguous with said coating, which mask defines said openings to be made in said coating;

placing said object in an R.F. sputtering chamber having an inert atmosphere at reduced pressure and exciting said object with an alternating R.F. potential to cause the removal of said coating in those portions which are not covered by said mask by R.F. sputtering until there remains a depth of said coating between about 100 to 1000 Angstroms above said semiconductor surface;

removing said object from said R.F. sputtering chamber; and chemically etching the remaining said coating to form said openings down to said semiconductor surface.

5. The method of claim 4 wherein said insulator coating is a composite coating of at least two easily fractured, inorganic layers, the upper of the said two layers being at least substantially removed in the area of the openings in said composite coating, and said chemical etching removing the remaining of said composite coating to form said openings down to the said semiconductor surface.

6. The method of claim 5 wherein the said composite coating includes an upper layer of silicon nitride and a protective layer of silicon dioxide.

7. The method of claim 4 wherein said insulator coating includes an upper coating of phosphosilicate glass and an under layer of silicon dioxide.

8. The method of claim 4 wherein said sputtering is continued until there remains a depth of said coating between about 300 to 600 Angstroms above said semiconductor surface.

References Cited

UNITED STATES PATENTS

| | | | |
|---|---|---|---|
| 2,702,274 | 2/1955 | Law | 204—192 |
| 3,165,430 | 1/1965 | Hugle | 156—17 |
| 3,287,243 | 11/1966 | Ligenza | 204—192 |

OTHER REFERENCES

Reports of the Academy of Science of the USSR Physical Chemistry, translation of Bokl. Akad. Nauk. USSR, vol. 104, pp. 579–81; 1955 by Spivak et al.

JOHN H. MACK, Primary Examiner

SIDNEY S. KANTER, Assistant Examiner

U.S. Cl. X.R.

156—8